United States Patent
Pop et al.

(10) Patent No.: US 9,324,422 B2
(45) Date of Patent: Apr. 26, 2016

(54) ADAPTIVE RESISTIVE DEVICE AND METHODS THEREOF

(75) Inventors: Eric Pop, Champaign, IL (US); Feng Xiong, Urbana, IL (US); Albert D. Liao, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 957 days.

(21) Appl. No.: 13/449,891

(22) Filed: Apr. 18, 2012

(65) Prior Publication Data

US 2013/0279245 A1 Oct. 24, 2013
US 2016/0111149 A9 Apr. 21, 2016

Related U.S. Application Data

(60) Provisional application No. 61/476,578, filed on Apr. 18, 2011.

(51) Int. Cl.
*G11C 13/00* (2006.01)
*G11C 13/02* (2006.01)
*H01L 45/00* (2006.01)
*B82Y 10/00* (2011.01)

(52) U.S. Cl.
CPC ............ *G11C 13/0004* (2013.01); *B82Y 10/00* (2013.01); *G11C 13/025* (2013.01); *H01L 45/06* (2013.01); *H01L 45/065* (2013.01); *H01L 45/1226* (2013.01); *H01L 45/1253* (2013.01); *H01L 45/144* (2013.01); *H01L 45/1625* (2013.01); *G11C 2213/35* (2013.01); *G11C 2213/53* (2013.01)

(58) Field of Classification Search
CPC .............. G11C 13/004; G11C 13/025; G11C 2213/35; H01L 45/06; H01L 45/144; B82Y 10/00
USPC ........... 365/148, 158, 163; 977/742, 789, 796
See application file for complete search history.

(56) References Cited

U.S. PATENT DOCUMENTS

| 5,668,766 | A | 9/1997 | Bramnik | |
|---|---|---|---|---|
| 6,574,130 | B2 | 6/2003 | Segal | |
| 7,321,130 | B2 * | 1/2008 | Lung et al. | 257/4 |
| 7,859,385 | B2 * | 12/2010 | Bertin et al. | 338/195 |
| 8,045,359 | B2 * | 10/2011 | Furuta | H01L 27/2463 365/100 |
| 8,094,484 | B2 * | 1/2012 | Takahashi | G11C 13/00 365/148 |
| 2003/0030519 | A1 | 2/2003 | Wyeth | |
| 2007/0120095 | A1 | 5/2007 | Gruner | |
| 2007/0158697 | A1 | 7/2007 | Choi | |

(Continued)

OTHER PUBLICATIONS

Adee, "The Mysterious Memristor", pp. 1-5, IEEE Spectrum Online; May 2008; http://www.spectrum.ieee.org/ may08/6207; website last visited May 5, 2008.

(Continued)

*Primary Examiner* — Tan T Nguyen
(74) *Attorney, Agent, or Firm* — Guntin & Gust, PLC; Andrew Gust

(57) ABSTRACT

A system that incorporates teachings of the subject disclosure may include, for example, a device including a nanoelectrode having a gap, and a resistive change material located in the gap, wherein an application of a voltage potential across first and second terminals of the nanoelectrode causes the resistive change material to modify at least one non-volatile memory state of the resistive change material. Additional embodiments are disclosed.

24 Claims, 9 Drawing Sheets

(56) References Cited

U.S. PATENT DOCUMENTS

| | | | |
|---|---|---|---|
| 2007/0233761 A1 | 10/2007 | Mouttet | |
| 2008/0224358 A1 | 9/2008 | Rogers | |
| 2008/0260941 A1 | 10/2008 | Jin | |
| 2009/0107834 A1 | 4/2009 | Ye | |
| 2009/0161407 A1* | 6/2009 | Masuda | G11C 13/00 365/148 |
| 2010/0327247 A1 | 12/2010 | Ward et al. | |

OTHER PUBLICATIONS

Bonsor, "How Nanotechnology Works", http://science.howstuffworks.com/nanotechnology2.htm; Nov. 20, 2012.

Markoff, "H.P. Unveils New Memory Technology", pp. 1-3, New York Times; May 1, 2008; http://www.nytimes.com/2008/05/01/technology; website last visited May 5, 2008.

Sands, "Nanotubes and Nanowires", NCLT Jul. 13, 2006.

Strukov, "The Missing Memristor Found", 1 page, Nature International Weekly Journal of Science, 453, 80-83; May 1, 2008; http://www.nature.com/nature/journal/v453/n7191/abs/nature06932.html; website last visited May 5, 2008.

Aguirre, et al., "Carbon Nanotubes as Injection Electrodes for Organic Thin Film Transistors", Nano Letters, 2009, vol. 9, No. 4, 1457-1461.

Bruns, et al., "Nanosecond switching in GeTe phase change memory cells", Appl. Phys. Lett. 95, 043108 (2009).

Burr, et al., "Phase change memory technology", J. Vac. Sci. Technol. B 28(2), Mar./Apr. 2010.

Chen, et al., "Compact Thermal Model for Vertical Nanowire Phase-Change Memory Cells", IEEE Transactions on Electron Devices, vol. 56, No. 7, Jul. 2009.

Chen, et al., "Programmable via Using Indirectly Heated Phase-Change Switch for Reconfigurable Logic Applications", IEEE Electron Device Letters, vol. 29, No. 1, Jan. 2008.

Chen, et al., "Ultra-Thin Phase-Change Bridge Memory Device Using GeSb", IBM/Qimonda/Macronix PCRAM Joint Project.

Ielmini, et al., "Analytical model for subthreshold conduction and threshold switching in chalcogenide-based memory devices", J. Appl. Phys. 102, 054517 (2007).

Im, et al., "A Unified 7.5nm Dash-Type Confined Cell for High Performace PRAM Device", Process Development Team, Samsung Electronics Co. Ltd.

Kalb, et al., "Kinetics of crystal nucleation in undercooled droplets of Sb- and Te-based alloys used for phase change recording", J. Appl. Phys. 98, 054910 (2005).

Karpov, "Field-induced nucleation in phase change memory", Physical Review B 78, 052201 (2008).

Kolobov, et al., "Understanding the phase-change mechanism of rewritable optical media", Nature Materials, vol. 3, Oct. 2004.

Krebs, et al., "Threshold field of phase change memory materials measured using phase change bridge devices", Appl. Phys. Lett. 95, 082101 (2009).

Lacaita, "Phase change memories: State-of-the-art, challenges and perspectives", Solid-State Electronics 50 (2006) 24-30.

Lankhorst, et al., "Low-cost and nanoscale non-volatile memory concept for future silicon chips", Nature Materials, vol. 4, Apr. 2005.

Lee, et al., "Highly scalable non-volatile and ultra-lowpower phase-change nanowire memory", Nature Nanotechnology, vol. 2, Oct. 2007.

Lee, et al., "Highly Scalable Phase Change Memory with CVD GeSbTe for Sub 50nm Generation", 2007 Symposium on VLSI Technology Digest of Technical Papers.

Liao, "Avalanche-Induced Current Enhancement in Semiconducting Carbon Nanotubes", PRL 101, 256804 (2008).

Liao, et al., "Thermal dissipation and variability in electrical breakdown of carbon nanotube devices", Physical Review B 82, 205406 (2010).

Lyeo, et al., "Thermal conductivity of phase-change material $Ge_2Sb_2Te_5$", Appl. Phys. Lett. 89, 151904 (2006).

Meister, et al., "Void Formation Induced Electrical Switching in Phase-Change Nanowires", Nano Letters, 2008, vol. 8, No. 12, 4562-4567.

Pop, et al., "Electrical and thermal transport in metallic single-wall carbon nanotubes on insulating substrates", J. Appl. Phys. 101, 093710 (2007).

Pop, "Energy Dissipation and Transport in Nanoscale Devices", Nano Res (2010) 3: 147-169.

Qi, et al., "Miniature Organic Transistors with Carbon Nanotubes as Quasi-One-Dimensional Electrodes", J. Am. Chem. Soc. 2004, 126, 11774-11775.

Raoux, et al., "Phase Change Materials and Their Application to Nonvolatile Memories", Chem. Rev. 2010, 110, 240-267.

Redaelli, et al., "Electronic Switching Effect and Phase-Change Transition in Chalcogenide Materials", IEEE Electron Device Letters, vol. 25, No. 10, Oct. 2004.

Wang, et al., "Fast phase transitions induced by picosecond electrical pulses on phase change memory cells", Appl. Phys. Lett. 93, 043121 (2008).

Wong, et al., "Phase Change Memory", Proceedings of the IEEE, vol. 98, No. 12, Dec. 2010.

Wuttig, et al., "Phase-change materials for rewriteable data storage", Nature Materials, vol. 6, Nov. 2007.

Xiong, "Inducing chalcogenide phase change with ultra-narrow carbon nanotube heaters", Appl. Phys. Lett. 95, 243103 (2009).

Xiong, "Low Power Switching of Phase-Change Materials with Carbon Nanotube Electrodes", Science Express, Mar. 10, 2011.

Yao, et al., "Resistive Switching in Nanogap Systems on SiO2 Substrates", Small 2009, 5, No. 24, 2910-2915.

Yoon, "Phase-Change-Driven Programmable Switch for Nonvolatile Logic Applications", IEEE Electron Device Letters, vol. 30, No. 4, Apr. 2009.

Yu, et al., "Minimum Voltage for Threshold Switching in Nanoscale Phase-Change Memory", Nano Letters, 2008, vol. 8, No. 10, 3429-3433.

* cited by examiner

FIG. 1A
FIG. 1C
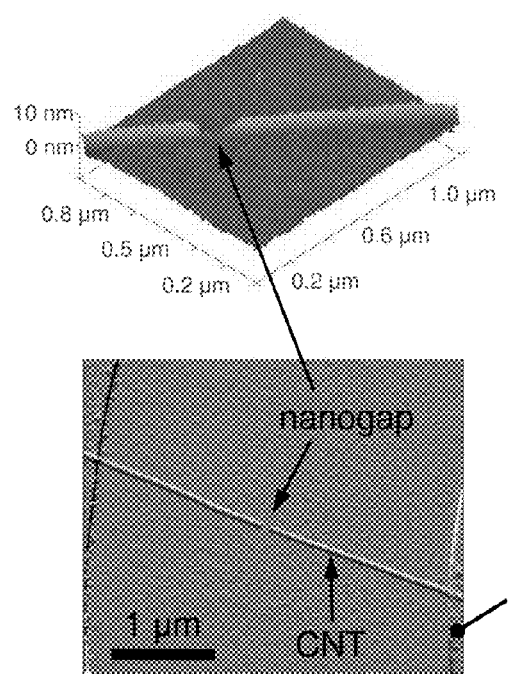
FIG. 1B
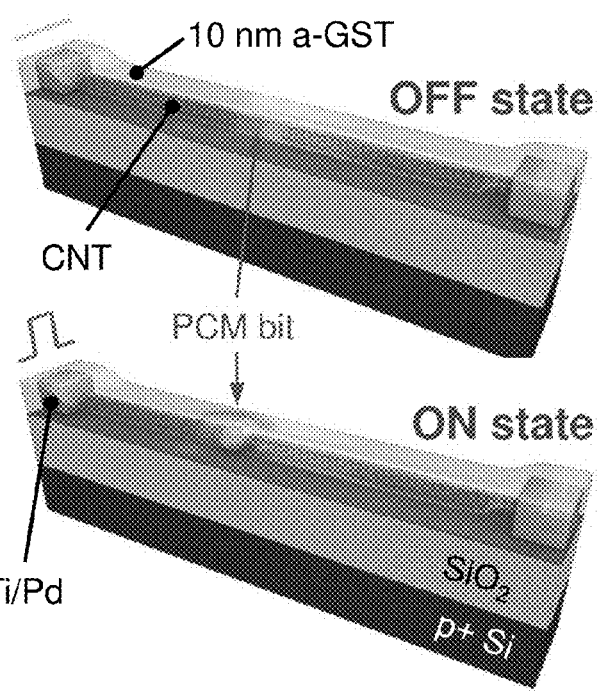
FIG. 1D

FIG. 2A
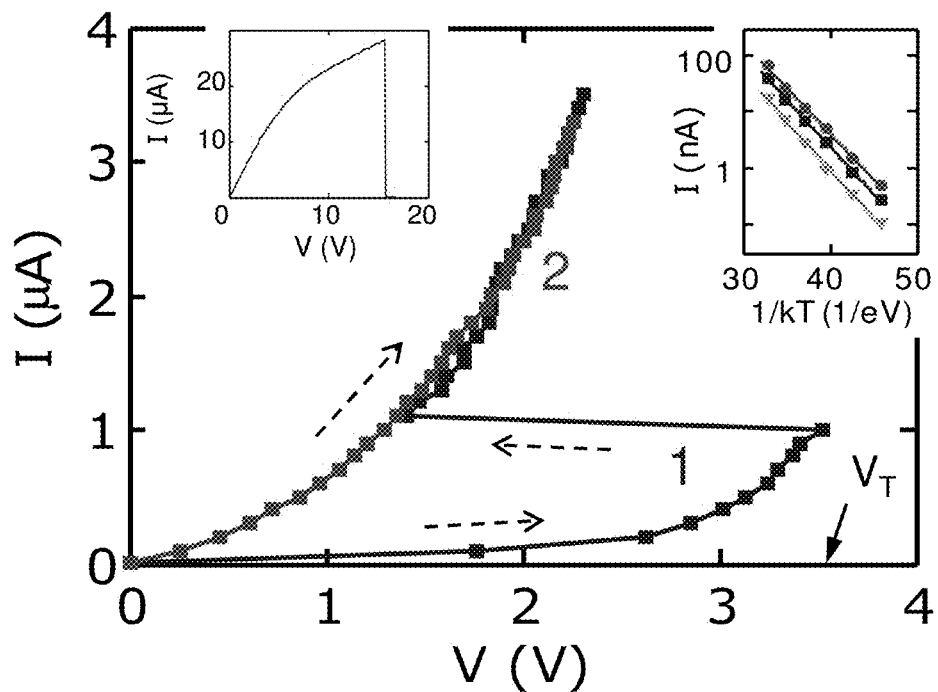
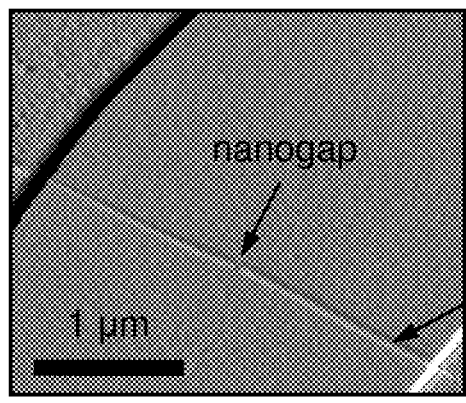
FIG. 2B
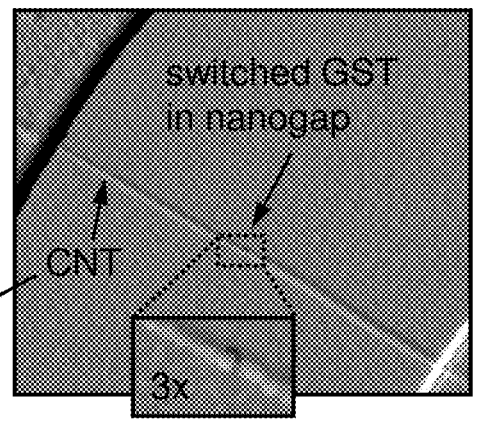
FIG. 2C

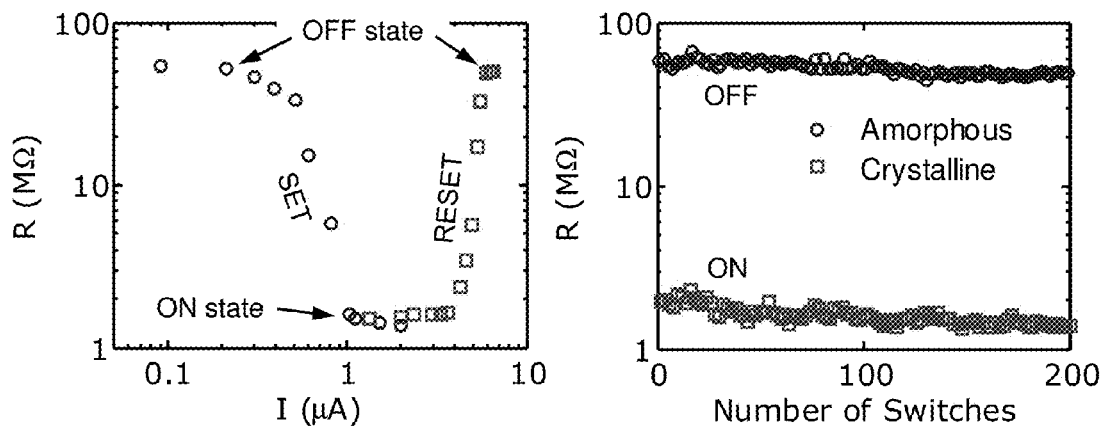
FIG. 3A  FIG. 3B
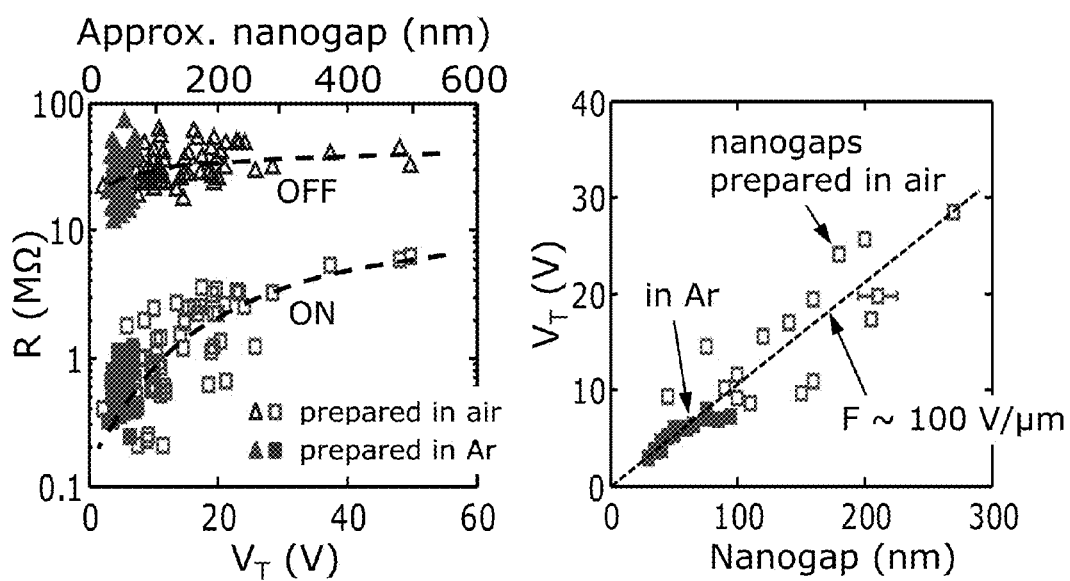
FIG. 4A  FIG. 4B

FIG. 7A
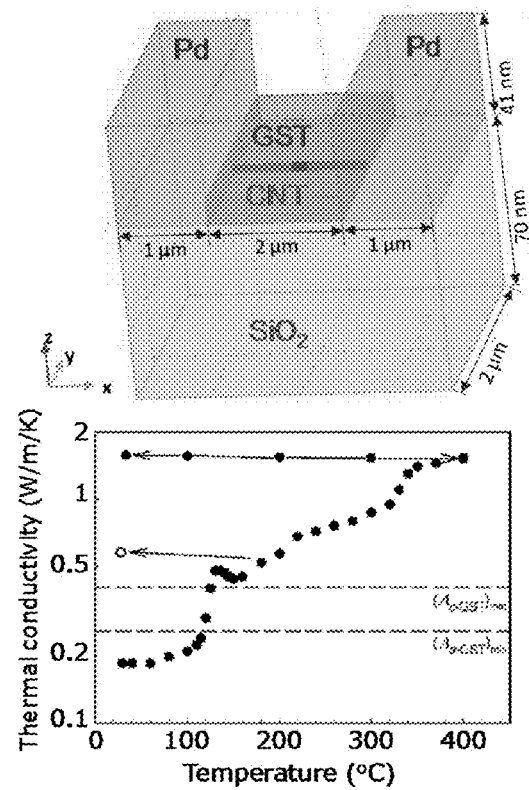
FIG. 7C
FIG. 7B
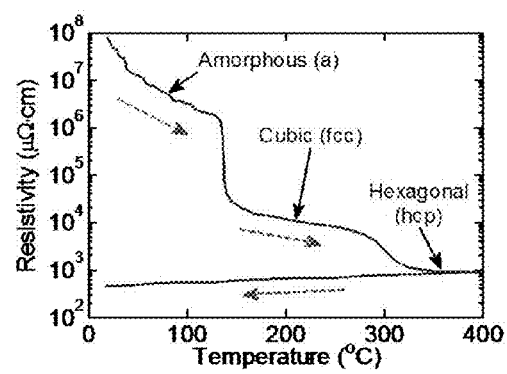
FIG. 7D
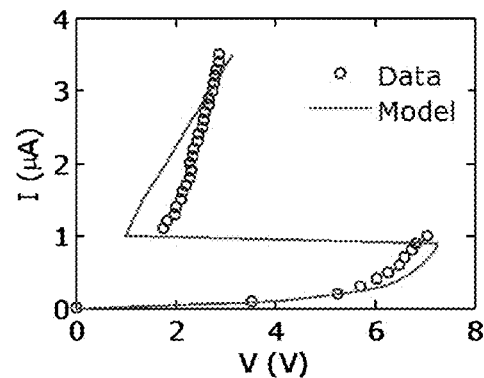

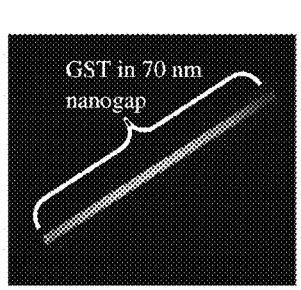 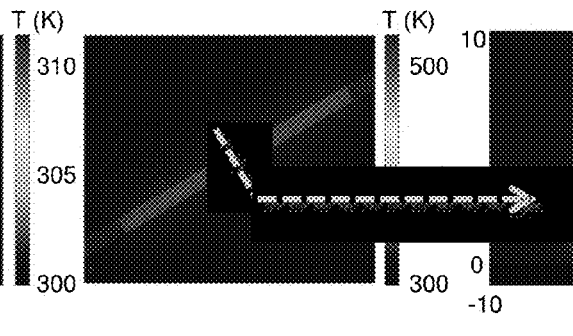 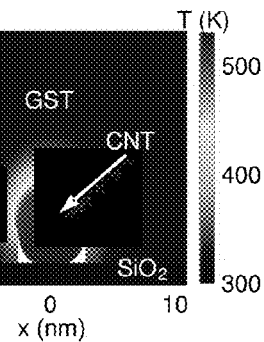
FIG. 8A  FIG. 8B  FIG. 8C
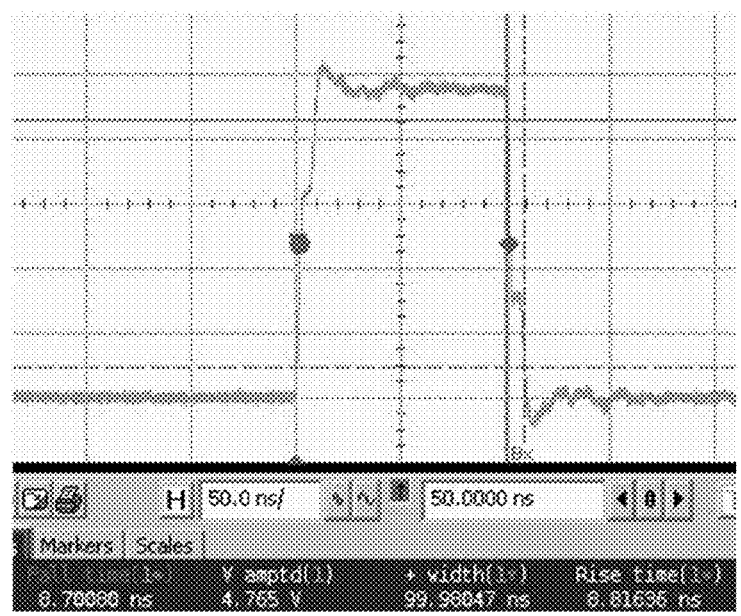
FIG. 9

FIG. 10A
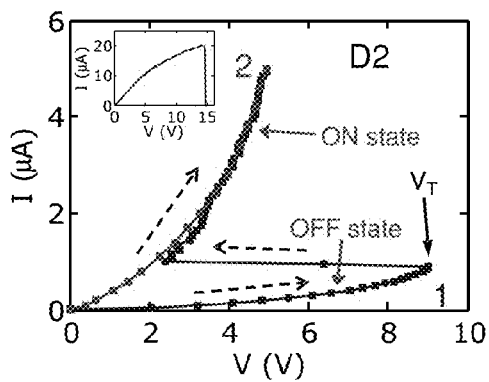
FIG. 10D
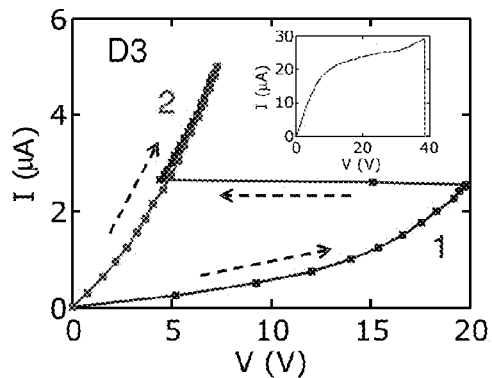
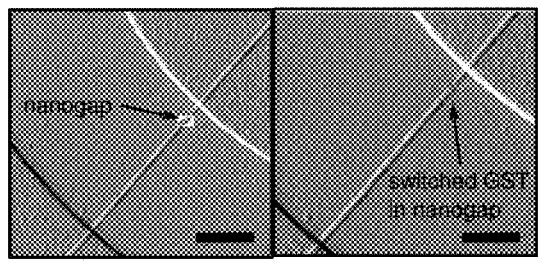
FIG. 10B     FIG. 10C
FIG. 10E     FIG. 10F
FIG. 11A            FIG. 11B
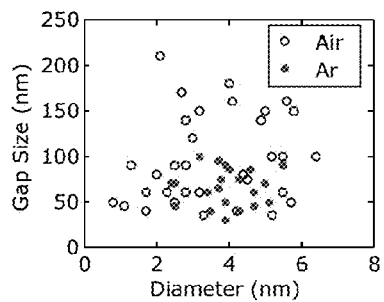 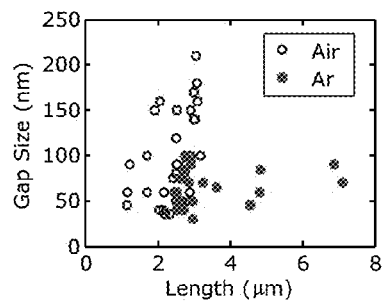
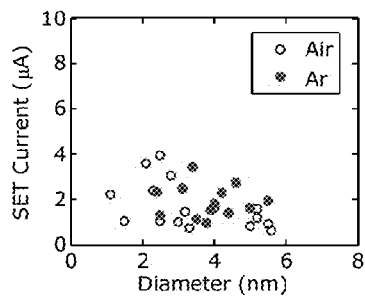 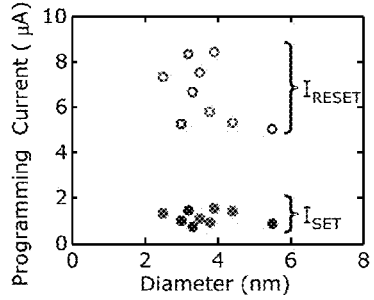
FIG. 11C            FIG. 11D

ADAPTIVE RESISTIVE DEVICE AND METHODS THEREOF

PRIOR APPLICATION

The present application claims the benefit of priority to U.S. Provisional Application No. 61/476,578 filed on Apr. 18, 2011, entitled, "Phase-Change Memory Cell with Carbon Nanotube and Graphene Electrodes," which is hereby incorporated by reference in its entirety.

STATEMENT AS TO FEDERALLY SPONSORED RESEARCH

This invention was made with government support under contract number N00014-09-0180 and N00014-10-1-0853 awarded by Office of Navy Research. The government has certain rights in the invention.

FIELD OF THE DISCLOSURE

The subject disclosure relates to an adaptive resistive device and methods thereof.

BACKGROUND

The mass-storage market is currently dominated by magnetic hard drives, which are typically used up to the terabyte range. In the gigabyte range, solid-state Flash memory is most commonly used. Hard drives contain movable parts and are slower, less robust, and more power-hungry than solid-state memory.

Ideally, robust low-power terabyte storage should be obtained through a universal memory which is immune to the above limitations. However, a need for radiation hardness and non-volatility (retain memory state when power is off) make electrical charge storage like Flash unfeasible at the smallest scales, when a bit consists of only a hundred (or fewer) electrons, such as below a 35 nm technology node.

Such few stored electrons lead to significant statistical bit-to-bit variation, as well as poor charge retention, since long-term storage imposes drastic leakage current limits, of the order of one or two electrons per month. Another drawback of Flash is its high write/erase voltage (~15 V), which is needed for tunneling in/out of the floating gate. Such voltages are incompatible with the low 1-2 V used in logic operation, and large-area charge pumps are often used for the step-up, consuming valuable on-chip real estate.

BRIEF DESCRIPTION OF THE DRAWINGS

Reference will now be made to the accompanying drawings, which are not necessarily drawn to scale, and wherein:

FIGS. 1A, 1B, 1C and 1D Schematics of Carbon NanoTube Phase Change Materials (CNT-PCM) device. (A) Atomic force microscope (AFM) imaging of nanogap created after CNT breakdown under electrical stress. (B) AFM image of an as-fabricated device. (C,D) Schematic of device obtained after deposition of $Ge_2Sb_2Te_5$ (GST) thin film. The device is in its OFF state immediately after fabrication, with highly resistive amorphous GST (a-GST) in the nanogap. (D) The device is switched to its ON state after an electric field in the nanogap transforms the bit to its conductive c-GST phase.

FIGS. 2A, 2B and 2C Initial antifuse-like switching. (A) Current vs. voltage (I-V) of a device with CNT diameter ~3 nm, nanogap ~35 nm, and GST film thickness ~10 nm. The initial sweep (#1) turns the bit ON at ~1 μA and $V_T$=3.5 V. The c-GST bit phase is subsequently preserved (#2). The left inset shows the I-V of the CNT as used to create the nanogap before GST deposition (20). The right inset shows temperature-activated transport in the subthreshold regime after a-GST deposition [also see FIGS. 13A-13B (19)]. The activation energy ~0.38 eV decreases slightly with voltage, consistent with trap-assisted transport in disordered a-GST (23). (B) and (C) show AFM images of the same device before and after switching. Small changes of GST volume in the gap can be seen after switching here without a capping layer (18).

FIGS. 3A and 3B Reversible memory operation using pulsed measurements. (A) Device resistance vs. current pulse magnitude. The width of the SET and RESET pulses are 150 ns (20 ns falling edge) and 50 ns (2 ns falling edge), respectively, as limited by our experimental setup. Sharp transitions are seen at 1 μA (SET) and 5 μA (RESET) current, two orders of magnitude lower than present state-of-the-art (9-14). (B) Memory endurance test showing excellent separation between ON and OFF state, with no degradation after hundreds of cycles (SET: 1.5 μA, 150 ns; RESET: 6.0 μA, 50 ns). The device shown here is covered by the ~5 nm $SiO_2$ encapsulation layer.

FIGS. 4A and 4B Scaling trends of memory devices. (A) ON- and OFF-state resistance for 105 devices shown vs. threshold voltage $V_T$. As marked, 61 nanogaps were created in air ambient (empty symbols), the other 44 devices were formed under Ar flow (solid symbols). Ar-formed nanogaps are consistently smaller (<100 nm) and yield lower-power devices. Dashed lines are trends to guide the eye. (B) Threshold voltages scale proportionally to size of nanogap, at an average field of ~100 V/μm. The dashed line is a linear fit, indicating excellent device scalability. Lateral error bar is estimated uncertainty from nanogap measurement under AFM.

SUPPLEMENTAL FIGURES

Figure 5:
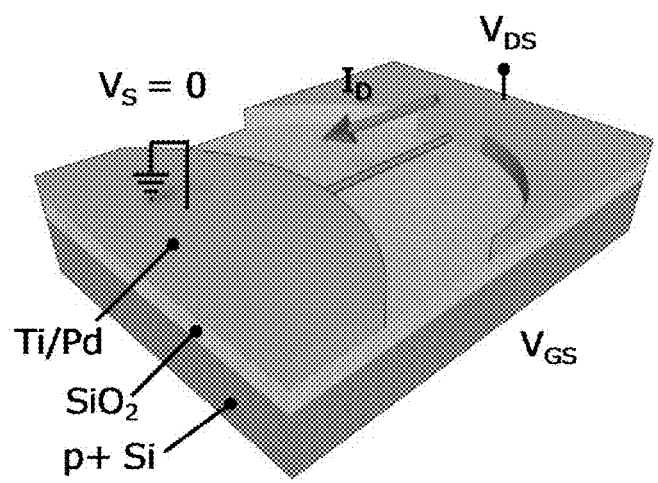

FIG. 5. The schematics of the initial CNT devices that are used in this work, before nanogap formation. Semi-circular electrodes are used for tighter control of CNT length (1-3).

Figure 6A:
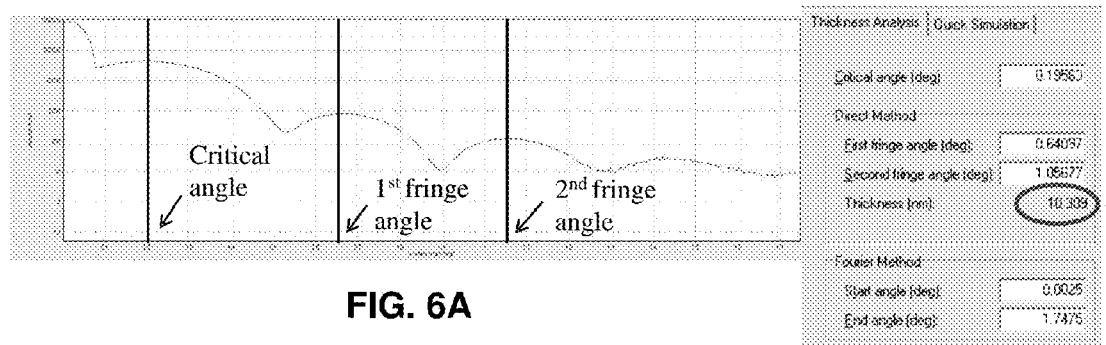
Figure 6B:
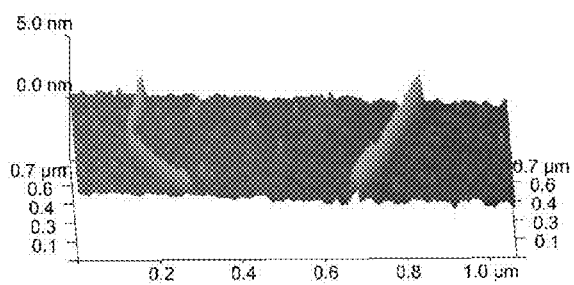
Figure 6C:
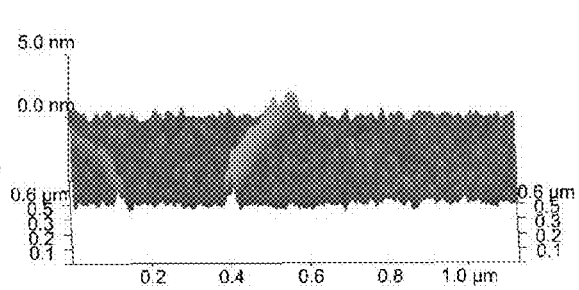

FIGS. 6A, 6B and 6C (A) X-ray reflectivity measurement of sputtered GST thin film using control samples. The control sample is fabricated by sputtering GST directly onto highly doped Si substrate immediately after the removal of the native oxide layer by wet etching. The measurement confirms the GST thin film thickness is 10 nm. (B) and (C) AFM images of CNTs before and after GST deposition, indicating the GST thin film is highly conformal with minimal roughness.

FIGS. 7A, 7B, 7C and 7D (A) Schematic of the 3-dimensional FE model of the CNT-PCM device from COMSOL simulations, closely following the experimental layout (FIG. 1 in main text). (B) Temperature dependence of GST resistivity and (C) thermal conductivity. (D) I-V characteristics (experimental data and simulations) of a nanotube-PCM device. The CNT length=2.0 μm, diameter=2.5 nm and nanogap size=70 nm; GST film is 10 nm thick. The snapback behavior is observed when the localized E-field in the gap exceeds the threshold value.

FIGS. 8A, 8B and 8C (A) Simulated temperature profile of GST in the nanogap before and (B) after it switches into the highly conductive state. Importantly, simulations show that the GST outside the nanogap region remains at relatively low temperature and thus still in the amorphous phase, primarily due to the low thermal conductivity of GST. This is an important feature, which enables the very small bit volume addressed here (few hundred cubic nanometers), and the ultra-low power operation. (C) Cross-sectional temperature profile of the GST in the center of the nanogap, indicating once again the highly confined current flow and heating region.

FIG. 9. A typical RESET pulse waveform.

FIGS. 10A, 10B, 10D, 10E and 10F Characterization of additional CNT-PCM devices. (A) and (D) I-V characteristics of two devices before and after SET. Devices have CNT diameter=2.5 nm (2.1 nm), CNT length=2.2 μm (3.8 μm) and nanogap size=100 nm (210 nm). SET currents are 0.9 μA (2.4 μA) and threshold voltages $V_T$=9 V (19.8 V). Insets show CNT I-V leading to nanogap formation. (B) and (E) are AFM images after nanogap formation. (C) and (F) are AFM images after SET operation. Note the inset shows the narrow (small volume) conductive GST path created, consistent with the simulation from FIG. 8A-8C. The scale bars are 0.5 μm.

FIGS. 11A, 11B, 11C and 11D (A) CNT nanogap dependence on CNT diameter. Blue circles indicate devices that were broken down ('cut') in air, red solid dots are devices that were prepared under Ar flow. (B) The CNT nanogap size vs. original CNT length. For both devices that were broken down in air and under Ar flow, we observe that CNTs with smaller length tends to have smaller gap size. (C) SET current vs. CNT diameter. No clear trend is observed. (D) SET and RESET current vs. CNT diameter for the same devices.

Figure 12:
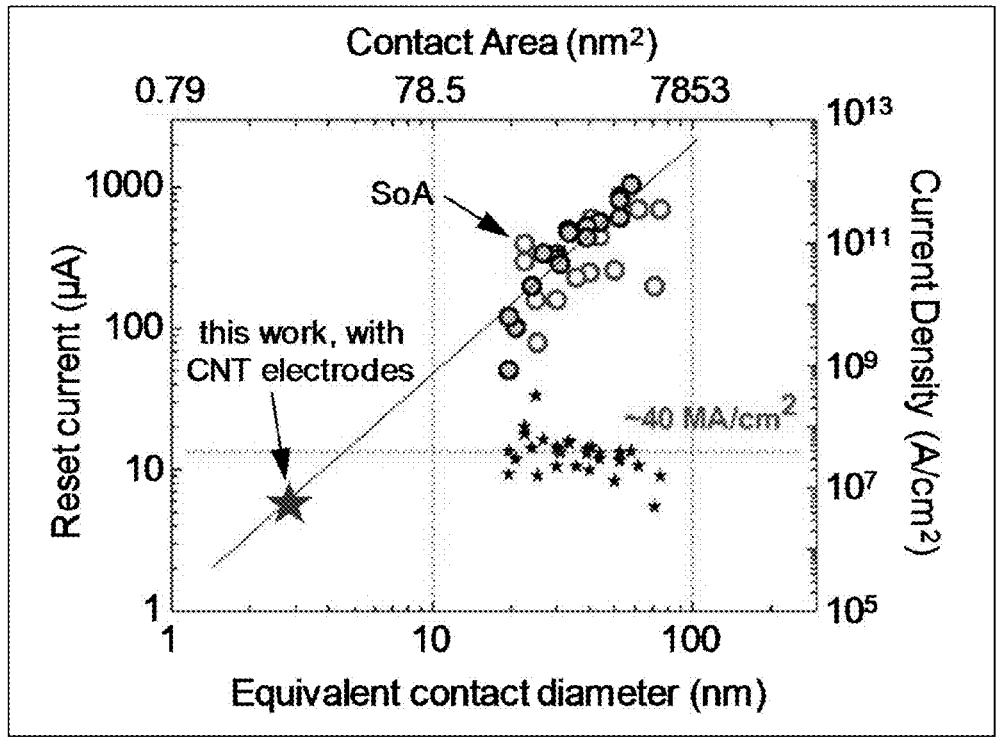

FIG. 12. Scaling of programming current in phase-change materials (PCM), >0.1 mA in commercial state-of-the-art (SoA) [after (10)]. Our results with CNT electrodes (this work) show approximately two orders of magnitude lower power and reset current.

Figure 13A:
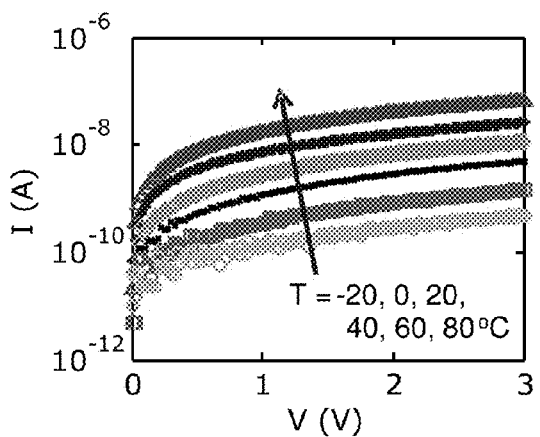
Figure 13B:
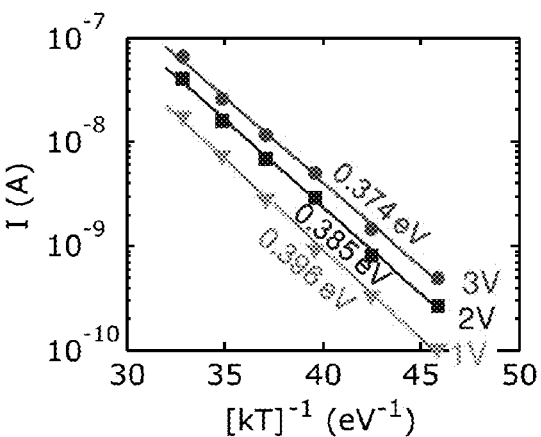

FIGS. 13A and 13B. Temperature dependent subthreshold measurements. (A) Current-voltage of ~10 nm thin film PCM in the subthreshold regime (in vacuum, with increasing temperature). (B) Arrhenius plot of subthreshold current. Activation energies are extracted from the negative slope of the fit, with values of $E_A$=0.396, 0.385 and 0.374 eV at applied bias 1, 2 and 3 V, respectively. These results show that even at ~10 nm GST film thicknesses and sub-50 nm bit dimensions, the subthreshold conduction mechanisms are similar to those previously reported for a-GST (14).

Figure 14:
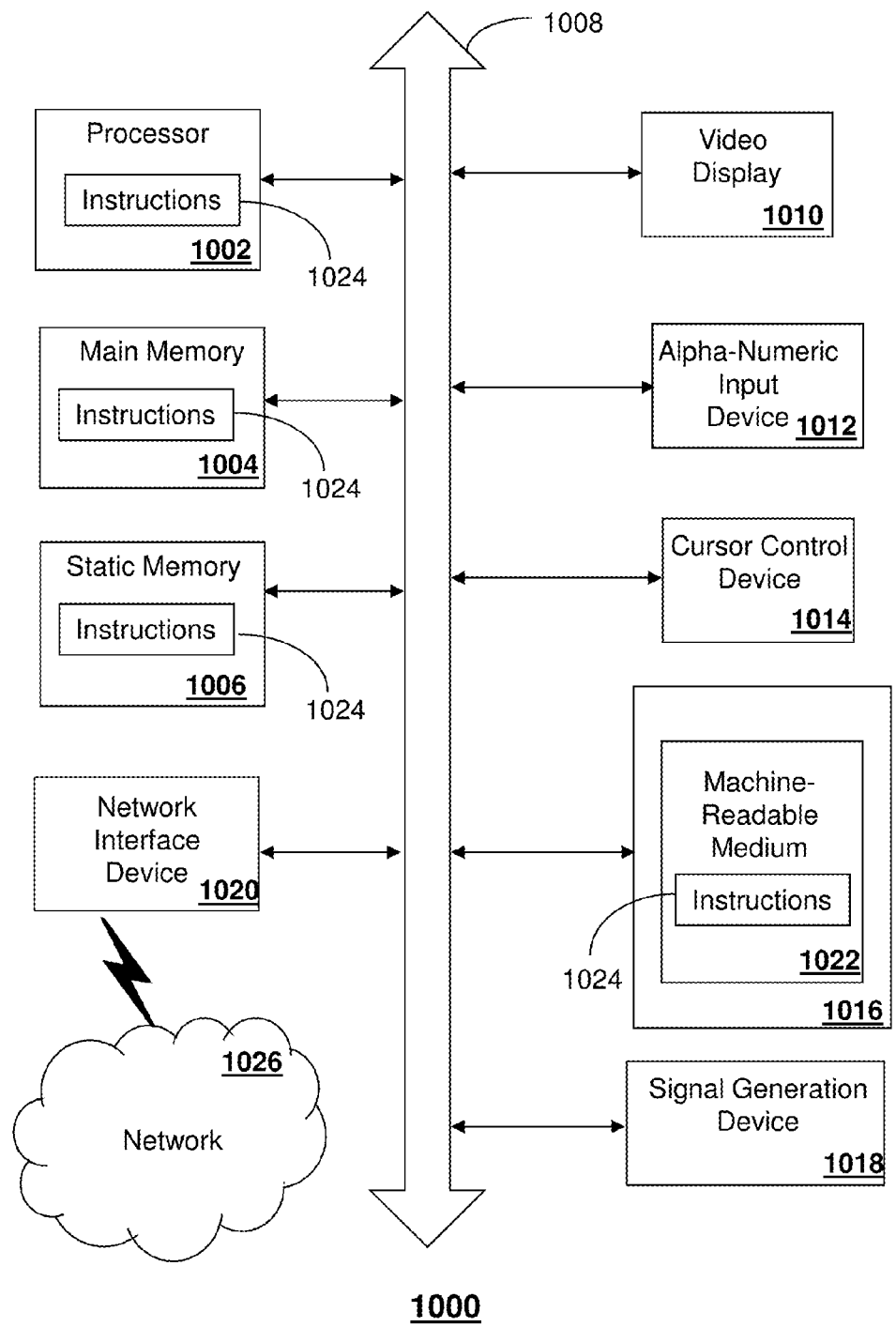

FIG. 14 depicts an illustrative diagrammatic representation of a machine in the form of a computer system within which a set of instructions, when executed, may cause the machine to perform any one or more of the methodologies disclosed herein.

Table 1. Material properties used in simulation are described and shown in the specification.

DETAILED DESCRIPTION

The subject disclosure can utilize or combine some or all embodiments described in U.S. patent application Ser. No. 12/463,953, filed on May 11, 2009, entitled, "Resistive Changing Device." The aforementioned patent application is hereby incorporated by reference in its entirety.

One embodiment of the subject disclosure entails a device including a nanoelectrode having a gap, and a resistive change material located in the gap, wherein an application of a voltage potential across first and second terminals of the nanoelectrode causes the resistive change material to modify at least one non-volatile memory state of the resistive change material.

One embodiment of the subject disclosure entails a method for applying from a voltage source a first signal to a terminal of a nanoelectrode to program a non-volatile memory state of a resistive change material, where the resistive change material is located in a nanogap of the nanoelectrode. The method also includes receiving at a sensor a second signal supplied by the terminal indicating that the resistive change material has been programmed to the non-volatile memory state.

One embodiment of the subject disclosure entails a method for constructing an electrode, creating a gap in the electrode thereby forming first and second segments of the electrode, and inserting a resistive change material in the gap, wherein a combination of the first and second segments of the electrode and the resistive change material forms a memory cell programmable to at least two memory states.

Phase change materials (PCMs) are promising candidates for nonvolatile data storage and reconfigurable electronics, but high programming currents have presented a challenge to realize low power operation. In the subject disclosure PCM bits are controlled with single-wall, small-diameter multiwall carbon nanotubes (CNTs) or graphene ribbons. This configuration achieves programming currents as low as 0.5 μA (SET) and 5 μA (RESET), two orders of magnitude lower than state-of-the-art devices. Pulsed measurements enable memory switching with very low power consumption. Analysis of over one hundred devices finds that the programming voltage and energy are highly scalable, and could be below 1 V and single femtojoules per bit, respectively.

Phase change materials (PCMs) are typically chalcogenides like $Ge_2Sb_2Te_5$ (GST) which have amorphous (a) and crystalline (c) phases with contrasting electrical and optical properties. PCMs are the active material in rewritable DVDs, where phase transformations are induced and read by a pulsed laser (1, 2). The data in electrically-programmable PCMs are stored as changes in bit resistivity (3-6), which can be reversibly switched with short voltage pulses and localized Joule heating. In this sense, PCMs are appealing vs. other semiconductor memories where data are stored as charge and are susceptible to leakage and volatile behavior. Electrically-programmable PCMs have captivated wide interest for applications in non-volatile memory (7, 8) and reprogrammable circuits (5, 6) with low voltage operation, fast access times, and high endurance (3, 4). These attributes make them contenders for a 'universal' non-volatile memory, which could replace all data storage from random-access memory to hard disks. However, a drawback of PCM state-of-the-art storage prior to this work has been the high programming current (>0.1 mA), as Joule heat must be coupled to a finite bit volume, previously achieved with 30 to 100-nm diameter nanowires (9-11) or metal vias (12-14).

The subject disclosure presents carbon nanotubes (CNTs) and graphene ribbons as electrodes (15, 16) to reversibly induce phase change in nanoscale PCM bits. The subject disclosure also presents findings addressing the potential size and power reduction that are possible for programmable bits of PCM. The subject disclosure demonstrates reversible switching with programming currents of a few μA, two orders of magnitude lower than state-of-the-art PCM devices. The subject disclosure also presents a device scaling study that suggests memory switching is possible with voltages below 1 V and energy less than femtojoules per bit.

The CNTs used in this work were grown by chemical vapor deposition (CVD) with Fe catalyst particles on $SiO_2$/Si substrates (17, 18) [also see online supplement (19)]. The subject disclosure presents single-wall CNTs, small diameter multi-wall CNTs, and graphene ribbons were used to switch PCM bits. The CNTs span metal contacts as shown in FIG. 1 and FIG. 5 (19). Nanoscale gaps were created in the CNTs through electrical breakdown (20) in air or under Ar flow, as illustrated in FIG. 1 and the left inset to FIG. 2A. This simple approach yielded a wide range of nanogaps (from ~20-300 nm) in more than 100 devices, which was essential for a subsequent scaling study. The nanogap is typically near the middle of the CNT, consistent with the electrical breakdown location and with negligible Pd contact resistance (20, 21). Then, a ~10-nm GST film was sputtered over the device surface [FIG. 7A (19)], with settings previously found to preserve the electrical characteristics of CNTs (18). This deposition fills the CNT nanogaps, creating self-aligned lateral PCM bits. Such devices can be readily switched and examined by atomic force microscopy (AFM) [FIGS. 6A-6C]; however, a ~5-nm $SiO_2$ or $SiN_x$ layer deposited after the GST without breaking vacuum (12) must be used to prolong the switching lifetimes.

Devices are initially in the OFF state (FIG. 1C) because the as-deposited GST films are amorphous (a-GST) and highly resistive, $R_{OFF}$~50 MΩ (22). A voltage applied at the CNT contacts creates a sizeable electric field (E-field) across the nanogap, and switches the GST bit to the crystalline phase (c-GST), which lowers the resistance by about two orders of magnitude, to $R_{ON}$~0.5 MΩ. Although a-GST covers the entire device, the switching occurs only in the nanogap, which is the location of highest E-field and Joule heating.

To test initial memory switching, we sourced current and measured voltage across the devices (FIG. 2). The amorphous bits displayed switching at a threshold voltage $V_T$ as is typical with GST (7, 8), and a sharp transformation to a conductive phase under high E-field. It is noted that little voltage is dropped across the CNT or graphene ribbon electrodes, which are always more conductive than the GST bit, as confirmed with finite-element (FE) simulations [see the online supplement (19)]. Transport in the a-GST material is temperature-activated (23) even in the ~10 nm thin films, as shown in the right inset of FIG. 2A and discussed in (19). Once threshold switching occurs, the bit crystallizes from Joule heating and this marks the SET transition. The SET current was of the order ~1 μA in more than 100 devices tested (19), two orders of magnitude lower than SET currents in conventional PCM. However, the threshold voltage $V_T$ scaled linearly with the nanogap size (see below). This linear relationship provides strong evidence that threshold switching in a-GST is driven by E-field (24, 25) even at the minimal bit sizes explored here.

The subject disclosure presents an examination of reversible switching of our devices through pulsed measurements. In FIG. 3A, the resistance after a series pulses is plotted with the same duration (150 ns) and increasing amplitude, starting from the resistive OFF state. The resistance decreases abruptly when the current exceeds ~1 μA, marking the SET transition. As in FIG. 2, this signals the transformation of GST in the nanogap to the c-phase, effectively 'reconnecting' the two CNT electrodes. The resistance increases again when the current exceeds ~5 μA, which is the RESET transition for this particular device. This behavior is consistent with fast melting and quenching of the bit (7), returning the material to the a-GST phase. Repeated cell switching (FIG. 3B) exhibited good stability after several hundred cycles in devices encapsulated by $SiO_2$, as described above.

The dimensions of the bits examined here are in general defined by the small nanogaps (down to ~20 nm), the thin (~10 nm) GST film, and the CNT electrode diameters (~1-6 nm). The low thermal conductivity of GST (19) appears to play a role in laterally confining the bit to a scale not much greater than the CNT diameter. The small lateral extent of the bits can be seen in FIG. 2C and FIG. 10A-10F (19), also confirmed with FE simulations in FIG. 8A-8C (19). It is noted that the effective bit volumes addressed here are as small as a few hundred cubic nanometers.

The subject disclosure presents a statistical study of more than 100 devices in FIG. 4. First, the subject disclosure presents a plot of $R_{ON}$ and $R_{OFF}$ vs. their respective threshold voltage $V_T$ in FIG. 4A, showing two distinct memory states for every device studied. During fabrication, 61 of the CNT nanogaps were created in air and 44 were created under Ar flow, the latter with smaller gaps due to reduced oxygen (15, 19, 20). We note $R_{OFF}$ values are fairly constant (22). However, $R_{ON}$ scales proportionally with $V_T$ as seen in FIG. 4A, because both $R_{ON}$ and $V_T$ are related to the nanogap size. $R_{ON}$ is dominated by the resistance of the c-GST and proportional to the nanogap size, as the CNT electrodes are much more conductive. The nanogap size also determines $V_T$, because threshold switching in a-GST is driven by the E-field in the nanogap. The linear scaling trend between $V_T$ and nanogap size in FIG. 4B supports this observation, with an average threshold field of ~100 V/μm. This value is comparable to ~56 V/μm threshold field measured in 30-nm GST films (26) and an order of magnitude lower than the breakdown field of $SiO_2$ (27), indicating the switching indeed occurs in the GST bit. The mean SET currents across all nanogaps fabricated in air and Ar were nearly identical at ~2 μA, with a range of 0.5 to 4 μA [FIG. 11C (19)]. RESET currents were typically four times higher, ranging from 5 to 8.5 μA as shown in FIG. 3 and FIG. 11D (19).

Experimental results show switching occurred at <1 μA (SET), <5 μA (RESET), and <3 V across 20-30 nm nanogaps, with only a few microwatts of programming power. The programming current and power are two orders of magnitude lower than present state-of-the-art (12-14), enabled by the very small volume of PCM addressed with a single CNT. The minimum energy per bit obtained with our sharpest (~20 ns) pulses is of the order ~100 femtojoules. However, the linear trend of $V_T$ with nanogap size (FIG. 4B) reveals such devices are highly scalable, and suggests that ~5 nm GST bits with CNT electrodes could operate at ~0.5 V and <1 μA, such that nanosecond switching times (28, 29) would lead to sub-femtojoule per bit energy consumption [for additional estimates see Section 6 of online supplement (19)]. Low-voltage operation could also be achieved by using materials with lower threshold fields, such as GeSb (26). These results are encouraging for ultra-low power electronics and memory based on programmable PCM with nanoscale carbon interconnects.

REFERENCES AND NOTES

1. M. Wuttig, N. Yamada, *Nature Materials* 6, 824 (2007).
2. A. V. Kolobov et al., *Nature Materials* 3, 703 (2004).
3. A. L. Lacaita, *Solid-State Electronics* 50, 24 (2006).
4. M. Lankhorst, B. Ketelaars, R. Wolters, *Nature Materials* 4, 347 (2005).
5. K. N. Chen et al., *IEEE Electron Dev. Lett.* 29, 131 (2008).
6. S. M. Yoon, S. W. Jung, S. Y. Lee, Y. S. Park, B. G. Yu, *IEEE Elec. Dev. Lett.* 30, 371 (2009).
7. G. W. Burr et al., *J. Vac. Sci. & Tech. B* 28, 223 (2010).
8. S. Raoux, W. Welnic, D. Ielmini, *Chemical Reviews* 110, 240 (2009).
9. S.-H. Lee, Y. Jung, R. Agarwal, *Nature Nanotechnology* 2, 626 (2007).
10. D. Yu, S. Brittman, J. S. Lee, A. L. Falk, H. Park, *Nano Letters* 8, 3429 (2008).
11. S. Meister, D. T. Schoen, M. A. Topinka, A. M. Minor, Y. Cui, *Nano Letters* 8, 4562 (2008).
12. Y. C. Chen et al., in *Intl. Electron Devices Mtg (IEDM)*, DOI: 10.1109/IEDM.2006.346910 (2006).
13. J. I. Lee et al., in *Symp. VLSI Tech.*, DOI: 10.1109/VLSIT.2007.4339744. (2007), pp. 102-103.
14. D. H. Im et al., in *Intl. Electron Devices Mtg (IEDM)*, DOI: 10.1109/IEDM.2008.4796654. (2008).

15. P. Qi et al., *J. Am. Chem. Soc.* 126, 11774 (2004).
16. C. M. Aguirre, C. Ternon, M. Paillet, P. Desjardins, R. Martel, *Nano Letters* 9, 1457 (2009).
17. A. Liao, Y. Zhao, E. Pop, *Physical Review Letters* 101, 256804 (2008).
18. F. Xiong, A. Liao, E. Pop, *Applied Physics Letters* 95, 243103 (2009).
19. See supplemental FIGS. S1-S9.
20. A. Liao et al., *Physical Review B* 82, 205406 (2010).
21. E. Pop, D. A. Mann, K. E. Goodson, H. J. Dai, *J. Appl. Phys.* 101, 093710 (2007).
22. As the entire device is covered by a-GST, $R_{OFF}$ is limited by (small) leakage between the metal electrodes.
23. D. Ielmini, Y. Zhang, *J. Appl. Phys.* 102, 054517 (2007).
24. A. Redaelli et al., *IEEE Elec. Dev. Lett.* 25, 684 (2004).
25. V. G. Karpov, Y. A. Kryukov, I. V. Karpov, M. Mitra, *Physical Review B* 78, 052201 (2008).
26. D. Krebs et al., *Applied Physics Letters* 95, 082101 (2009).
27. J. Yao et al., *Small* 5, 2910 (2009).
28. G. Bruns et al., *Applied Physics Letters* 95, 043108 (2009).
29. W. J. Wang et al., *Appl. Phys. Lett.* 93, 043121 (2008).

1. Methods of CNT Device Fabrication

Carbon nanotubes (CNTs) were grown by chemical vapor deposition (CVD) using a mixture of $CH_4$ and $C_2H_4$ as the carbon feedstock, and $H_2$ as the carrier gas at 900° C. The flow rate of $CH_4$ to $C_2H_4$ was kept large to grow predominantly single-walled CNTs. Fe (~2 Å thick deposited by e-beam evaporation) is used as the catalyst for CNT growth. The catalyst was deposited on ~70 nm thick $SiO_2$ and highly p-doped Si wafers. Patterned catalyst islands are formed using photolithography and lift-off. Prior to growth, the catalyst was annealed at 900° C. in Ar environment to ensure the formation of Fe nanoparticles, from which the CNTs grow. The nanotubes were contacted with Ti/Pd (½40 nm) electrodes defined using photolithography. The electrode separation on our test chips is varied from L~1-5 μm, although the exact CNT length is not essential for low-power GST switching, with the CNTs being much more conductive than GST.

2. GST Thin Film Deposition & Characterization

GST thin film deposition is done in high vacuum using an ATC 2000 custom four gun co-sputtering system (AJA International), with a deposition rate at 0.4 Å/s at 12 W DC power. Deposition at this rate ensures that there is only minimal damage to the CNT from the sputtering process (3). The sputtering target $Ge_2Sb_2Te_5$ was purchased from ACI Alloys Incorporated. Thin film thickness is characterized with X-ray reflectivity measurement using Philips Xpert Pro XRD system on control samples. By probing diffraction intensities at glancing angles of incidence, we are able to confirm the GST thin film thickness is 10.0±0.4 nm (FIG. 6A).

The subject disclosure illustrates atomic force microscopy (AFM) measurements on samples before and after GST deposition (FIG. 6B and 6C, respectively). The measured RMS surface roughness of our devices only increased minimally from ~0.3 nm to ~0.5 nm (3).

3. Three-Dimensional Finite Element Modeling

The subject disclosure presents a comprehensive 3D finite element (FE) model accounting for the electro-thermal interactions in our devices using COMSOL Multiphysics. In the simulation, an electrical model is used to predict the voltage and current distribution in the device; while a thermal model is employed to predict the temperature distribution. The two are coupled via Joule heating and the temperature dependence of material properties. The modeling schematic for the CNT-PCM device is consistent with the actual device structure and is shown in FIG. 7A.

In the electrical model, the Poisson and continuity equations are solved to obtain the voltage and current distribution in the device: $\nabla \cdot [\sigma(x,y,z,t)\nabla V]=0$. The electrical conductivity of GST, $\sigma_{GST}$, depends on its phase, temperature and in the case of amorphous GST (a-GST), the electric field, as shown in FIG. 7B. At T>150° C., the a-GST transforms into the face centered cubic (fcc) crystalline phase (c-GST), with a sharp drop in resistivity. When T>350° C., GST transforms into hexagonal closed pack (hcp) phase, with another (smaller) decrease in resistivity. The temperature dependence of GST resistivity (FIG. 7B) is numerically incorporated in our model and based on experimental results from Lankhorst et al (4).

The electrical conductivity of the CNT $\sigma_{CNT}$ is calculated based on a model developed by Pop et al (5): $\sigma_{CNT}=(4q^2/h)\cdot(\lambda_{eff}/A)$, where q is the elementary charge, h is Planck's constant, $\lambda_{eff}$ is the effective carrier mean free path, and A=πdb is the cross-sectional area of the CNT, where d and b (~0.34 nm) are the diameter and wall thickness of the nanotube respectively. The nanotube conductivity is temperature and position dependent through the effective mean free path $\lambda_{eff}$, which can be calculated using the Matthiessen's rule as: $\lambda_{eff}^{-1}=\lambda_{AC}^{-1}+\lambda_{OP,ems}^{-1}+\lambda_{OP,abs}^{-1}$.

On all external boundaries, electrically insulating boundary conditions are applied, except across the electrodes, where a constant current flow is assumed. Electrical contact resistance is simulated on interior boundaries between GST/electrodes (~150 kΩ), CNT/electrodes (~50 kΩ) and GST/CNT (~100 kΩ).

In the thermal model, the transient heat equation is used to obtain the temperature and GST phase in the device: $\nabla \cdot [k(x,y,z,t)\nabla T]+Q=C_v(\partial T/\partial t)$, where k is the thermal conductivity, T is the temperature, $Q=I^2R$ is the Joule heat generation and $C_v$ is the volumetric heat capacity. The thermal conductivity of GST ($k_{GST}$) depends both on temperature and phase (FIG. 7C) as described by Lyeo et al (6). Table 1 summarizes the main material properties used in this work:

Adiabatic thermal boundary conditions are used on all exterior boundaries except the bottom of the $SiO_2$, where a constant T=293 K is assumed (convective cooling by air and radiation loss are insignificant). At interior boundaries, thermal boundary resistance (TBR) is applied to model the heat fluxes and temperature gradients at the interfaces. The TBR is modeled by adding a very thin thermally resistive layer at all relevant interfaces, with thickness $d_{th}$ and thermal conductivity $k_{th}$ such that the TBR $R_{th}=d_{th}/k_{th}$. The Pd/CNT boundary is assumed to have a TBR $R_{th}=1.2\times10^7$ K/W (7); while a thermal conductance g=0.17 $WK^{-1}$ $m^{-1}$ per CNT length is applied at the CNT/$SiO_2$ boundary (5). All other interior boundaries have $R_{th}=2.5\times10^{-8}$ $m^2$ $KW^{-1}$ which is typical for many systems (8).

Different sets of simulations were performed each with increasing current flow. In each simulation, a constant current pulse was applied for 100 ns. The current-voltage simulation is compared to experimental data for a specific device in FIG. 7D. Blue circles show the experimental results of a CNT-PCM device with 2.0 μm CNT length, 2.5 nm CNT diameter, and 70 nm nanogap size. As described earlier, the voltage snapback behavior is caused by threshold switching in GST and followed by a→c phase change due to Joule heating. The FE model correctly captures these characteristics with the standard material parameters.

The temperature profile of GST in the CNT gap region before and after the threshold switching is illustrated in FIG. 8A-8C. In its highly resistive state, the current passing through the CNT-PCM device is on the order of 100 nA. At low voltage the Joule heat generated is insufficient to reach the GST crystallization temperature ~420 K (FIG. 8A). However, once the electric field (E-field) in the nanogap reaches the threshold value, the a-GST in the nanogap switches into a conductive state, and the local current density in the GST nanogap increases drastically. At this point, sufficient heat is generated to raise the temperature to where the GST changes into its stable crystalline phase (c-GST). The bulk GST that is not exposed to high E-field and current flow remains in the highly resistive a-GST phase and therefore does not heat up significantly (FIGS. 8A-8C).

4. Additional Electrical & AFM Measurements

Electrical measurements were performed with a Keithley 4200 Semiconductor Characterization System (SCS), a Keithley 3402 Pulse Generator (PG), and an Agilent Infinium 50004A oscilloscope. The device resistance after applying the SET and RESET pulses is measured with the 4200 SCS at a 2.0 V DC bias. The SET and RESET current magnitudes were calculated from the applied voltage amplitude and the device resistance. FIG. 9 shows a typical waveform.

FIG. 10A-10F shows additional electrical and AFM measurements of other the nanotube-PCM devices. These are similar to those shown in FIG. 2A-2C, but for devices with larger nanogap size, and consequently larger threshold voltage $V_T$. These devices have nanogaps of ~100 nm and ~210 nm, and $V_T$=9 V and 19.8 V, respectively, representative of the general scaling trend observed in FIG. 4 of the main text (a→c switching is E-field driven).

5. Comparison of CNT Nanogap Formation in Air and Ar Flow

In order to create the CNT nanogaps, electrical breakdown of CNTs were performed both in ambient air and under Ar flow. CNTs were also 'cut' with AFM manipulation, but the electrical breakdowns offered a much faster route to obtain a wide range of nanogaps (FIG. 4). Of course, while the CNT breakdown method is extremely useful here, it would not be the preferred route for obtaining nanogaps in a more scalable manufacturing environment. It is useful to present some observations associated with this technique in the subject disclosure.

First, it is noted that CNT breakdowns 'under Ar flow' were done by flowing Ar (which is heavier than air) from a small nozzle over the entire test chip while probing. Thus, some diminished amount of oxygen was still available for CNT breakdown, unlike the breakdowns performed in vacuum in the second panel of FIG. 2C of Ref (1). There, the CNT break in vacuum could lead to $SiO_2$ damage, which was not seen here either in ambient air or under Ar flow.

Second, nanogaps formed in Ar are always smaller (always <100 nm) due to the diminished amount of oxygen, as seen in FIG. 4 (main text) and FIGS. 11A-11D (below). This is useful because CNT-PCM devices with smaller nanogap size operate at lower threshold voltages.

The subject matter presents additional statistics for all devices measured by AFM in FIGS. 11A-11D. No clear dependence is found between nanogap size and CNT diameter (FIG. 11A). In a sense, this is encouraging because it suggests that tight control of CNT electrode diameter may not be necessary to make very low power devices. Simulations (FIGS. 8A-8C and 9) also suggest this is the case, because the resistance of the GST bit always dominates that of the CNT (both in the a- and c-GST phase), thus rendering variability in the CNT of less importance. This fact could be important for mass production of such electronics where some amount of CNT variability could be tolerated.

FIG. 11B shows the dependence of nanogap size on CNT length, after both air and Ar-flow breakdowns. These data seem to suggest some dependence of nanogap size on CNT length for nanogaps created in ambient air. This was also noted in Ref (9), although at smaller CNT lengths (<1 μm) where the CNT temperature profile would be more steeply varying. On the other hand, for CNTs longer than ~1 μm the temperature profile is relatively flat (5). FIG. 11C shows the range of SET currents (~0.5 to 4 μA) across all devices tested where diameter data from AFM was also available. FIG. 11D compares SET and RESET current for the subset of devices where both these and AFM data were available. The RESET current range is ~5 to 8.5 μA.

6. Device Scaling Estimates

Devices in this study have shown 20-30 nm nanogaps with threshold voltages below 3 V, SET currents below 1 μA, and RESET currents ~5 μA. This corresponds to programming power below 3 μW (2.6 μW for 'best case'), significantly lower than the nearly ~1 mW programming power in conventional PCM devices. Such record-low power is achieved because of the extremely low effective bit volumes (hundreds of cubic nanometers) that can be addressed with CNT electrodes of few-nanometer diameters. Moreover, the scaling trend in FIG. 4B indicates such devices are highly scalable, and even lower (perhaps by another ~10×) switching power may be possible.

To understand these limits, 5 nm nanogaps between CNT electrodes were considered, which should lead to SET switching voltage and current of ~0.5 V and 0.2 μA, respectively. The PCM volumes of such smallest addressable bits would be of the order ~20 $nm^3$. In addition, a comparable volume of the surrounding GST and $SiO_2$ will be heated up to approximately ⅓ of the temperature of the GST bit, based on the simulations of FIGS. 8A-8C and Ref (7). Here, the three roles of the CNT as the smallest low-resistance electrodes (~2 nm diameter) and that of low thermal conductivity of the GST and $SiO_2$ (~1 $Wm^{-1} K^{-1}$) and that of the CNT-GST interface thermal resistance are important in limiting the bit volume. This is in accord with experimental observations in FIGS. 10A-10F above and FIG. 2C in the main text, where only a GST volume of diameter comparable to that of the CNT is addressed and participates in switching; this fact is also supported by our simulations, see FIGS. 8A-8C.

The absolute lowest limits of programming energy of the smallest GST bits were estimated as follows. GST and $SiO_2$ heat capacity is taken from Table 1 (7), a temperature rise $\Delta T$~150 K for the a→c transition (SET) and $\Delta T$≈600K for the c→a transition (RESET). The programming energy/bit is $E = \Sigma C_i V_i \Delta T_i$ where the subscript i represents the material heated (GST or $SiO_2$) and $V_i$ is the respective volume (7, 8). The absolute minimum energy needed to heat up and switch such small bits are $E_{SET}$≈5×$10^{-18}$ J (=5 aJ) and $E_{RESET}$≈2× $10^{-17}$ J (=20 aJ).

More conservative (and realistic) estimates can be obtained considering that the shortest pulses known to induce switching in GST today are of the order ~2.5 ns for SET and 0.4 ns for RESET (11). The switching estimates then become $E_{SET}$≈$E_{RESET}$≈0.2 fJ, with programming power of the order ~0.1 μW. In practice, the sharpest pulses in this work are ~20 ns, limited by the Keithley 3402 pulse generator and our pad and cable layout. These lead to switching energy of the order ~100 fJ/bit in this work. While these calculations are simple, they are backed up by finite-element simulations [Section 3 above, and Ref (7)], and they serve as useful indicators of the energy and power dissipation limits of such devices.

The RESET current and current density of prototype devices were compared with that of state-of-the-art (SOA)

technology, as shown in FIG. 12. This figure compares our results with those widely available among SOA as summarized by Ref (10). The typical current density of SOA devices is of the order 40 MA/cm² (with a fairly broad spread, from 10-100 MA/cm²) as shown in FIG. 12. The best RESET current of our devices is ~5 µA (FIGS. 11A-11D), but the current density varies from a maximum at the "tip" of the CNT electrodes to a minimum as the current spreads into the GST bit (FIG. 8A-8C). With this consideration, prototype device current density is also in the range ~10-100 MA/cm², which is consistent with the present SOA. The significant advantage of prototype device geometry comes from the extremely small diameter and good conductivity of the CNT electrodes.

7. Comparison with Critical Nucleus Size in GST

In this Section a comparison is made of minimum bit sizes (as small as a few hundred cubic nanometers, as described in Section 6) with the minimum dimensions imposed by the critical nucleus in GST. The crystallization process in GST is nucleation driven. According to classical nucleation theory, there is a critical radius $r_c$, below which the crystallization process is energetically not favorable. This critical radius $r_c$ may be calculated from the interfacial free energy $\sigma$ and the Gibbs free energy difference between the parent and the crystalline phase per unit volume $\Delta G_{lc,V}$, as $r_c = 2\sigma/\Delta G_{lc,V}$ (12). Taking $\sigma = 40$ mJ/m² (13), $\Delta G_c = 1.15$ eV and using the relationship $\Delta G_c = (16\pi/3)\sigma^3/(\Delta G_{lc,V})^2$ (12), the critical radius is estimated to be $r_c \sim 1.05$ nm. The smallest GST bits addressed in our experiments are of the order ~10 nm, being approximately an order of magnitude greater than $r_c$ in any of the three directions. This suggests that smaller volumes of GST could be addressed still, with sub-femtojoule switching energy as estimated above.

8. Subthreshold Measurements of Ultra-Thin GST

We investigated the temperature dependence of our a-GST subthreshold current to understand the transport mechanism. The subthreshold I-V of a typical CNT-PCM device (here with $V_T = 7.2$ V) as a function of temperature in vacuum are shown in FIG. 13A-13B. The subthreshold current shows an exponential dependence on applied voltage >0.5 V, which is typical in amorphous chalcogenides (14), confirming the a-GST transport. To further understand this, we extract the activation energy of our a-GST as a function of its applied bias. For any voltage, we plot the subthreshold current at different temperatures as a function of 1/kT, as shown in the Arrhenius plot in FIG. 13B (also FIG. 2A right inset). We obtain the activation energy as the negative of the slope of the linear fit, here $E_A = 0.396$, 0.385 and 0.374 eV for applied bias of 1, 2 and 3 V, respectively. While more work is needed to understand subthreshold conduction in such thin GST films (here ~10 nm), these results are similar to Ref (14) for thicker films. This result is important by itself, as it confirms that the conduction mechanism even in the ~10 nm thin a-GST films used here is a temperature- and field-activated trap-assisted mechanism. The activation energy decreases as the applied bias increases, since the electric field lowers the potential barrier (14).

9. Supplementary References

1. A. Liao et al., *Physical Review B* 82, 205406 (2010).
2. A. Liao, Y. Zhao, E. Pop, *Physical Review Letters* 101, 256804 (2008).
3. F. Xiong, A. Liao, E. Pop, *Applied Physics Letters* 95, 243103 (2009).
4. M. Lankhorst, B. Ketelaars, R. Wolters, *Nature Materials* 4, 347 (2005).
5. E. Pop, D. A. Mann, K. E. Goodson, H. J. Dai, *J. Appl. Phys.* 101, 093710 (2007).
6. H. K. Lyeo et al., *Applied Physics Letters* 89, 151904 (2006).
7. I. R. Chen, E. Pop, *IEEE Trans. Electron Dev.* 56, 1523 (2009).
8. E. Pop, *Nano Research* 3, 147 (2010).
9. P. Qi et al., *J. Am. Chem. Soc.* 126, 11774 (2004).
10. H.-S. P. Wong et al., *Proceedings of the IEEE* 98, 2201 (2010).
11. W. J. Wang et al., *Appl. Phys. Lett.* 93, 043121 (2008).
12. S. Raoux, M. Wuttig, Eds., *Phase Change Materials*, (Springer, 2008), pp. 127.
13. J. A. Kalb, F. Spaepen, M. Wuttig, *Journal of Applied Physics* 98, 054910 (2005).
14. D. Ielmini, Y. Zhang, *J. Appl. Phys.* 102, 054517 (2007).

From the foregoing descriptions, it would be evident to an artisan with ordinary skill in the art that the aforementioned embodiments can be modified, reduced, or enhanced without departing from the scope and spirit of the claims described below. For example, a memory cell based on a combination of a nanotube or graphene ribbon and PCM material located in a nanogap can be used to construct an array of memory cells. The array of memory cells can be coupled to an encoder circuit for selectively programming the memory array with memory values, and for erasing memory cells selectively or in bulk. The array of memory cells can also be coupled to a decoder circuit for reading memory values. The encoder and decoder circuits can be adapted to perform programming, reading and erasing of portions of the memory cells according the procedures described above (see, for example, FIGS. 2A-2C and accompanying disclosure descriptions).

In another embodiment, the memory cells can be constructed as an array of parallel nanotubes or graphene ribbons with PCM material in a nanogap. In yet another embodiment, the parallel nanotubes with PCM material in the nanogap can be constructed on a planar surface of a substrate. In another embodiment, parallel nanotubes or graphene ribbons with PCM material in the nanogap can be constructed perpendicular (vertical) to the substrate to create denser memory arrays.

In yet another embodiment, the nanotube or graphene ribbon with PCM material in the nanogap can be used as a switching element for conducting or blocking signals in a circuit. In another embodiment, the nanotube or graphene ribbon with PCM material in the nanogap can be coupled to one or more transistors to control one or more operations of the one or more transistors.

Other suitable embodiments are contemplated by the subject disclosure.

FIG. 14 depicts an exemplary diagrammatic representation of a machine in the form of a computer system 1000 within which a set of instructions can be stored in one or more memory arrays utilizing the principles described in the subject disclosure. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1000 may include a processor 1002 (e.g., a central processing unit (CPU), a graphics processing unit (GPU, or both), a main memory 1004 and a static memory 1006, which communicate with each other via a bus 1008. The computer system 1000 may further include a video display unit 1010 (e.g., a liquid crystal display (LCD), a flat panel, or a solid state display. The computer system 1000 may include an input device 1012 (e.g., a keyboard), a cursor control device 1014 (e.g., a mouse), a disk drive unit 1016, a signal generation device 1018 (e.g., a speaker or remote control) and a network interface device 1020.

The disk drive unit 1016 may include a tangible computer-readable storage medium 1022 on which is stored one or more sets of instructions (e.g., software 1024) embodying any one or more of the methods or functions described herein, including those methods illustrated above. The instructions 1024 may also reside, completely or at least partially, within the main memory 1004, the static memory 1006, and/or within the processor 1002 during execution thereof by the computer system 1000. The main memory 1004 and the processor 1002 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 622 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA) are contemplated for use by computer system 1000.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A device, comprising:
   a nanoelectrode comprising a gap; and
   a resistive change material located in the gap, wherein an application of a voltage potential across first and second terminals of the nanoelectrode causes the resistive change material to modify at least one non-volatile memory state of the resistive change material.

2. The device of claim 1, wherein the nanoelectrode and the resistive change material form a memory cell having at least two non-volatile states.

3. The device of claim 1, wherein the nanoelectrode and the resistive change material form a switching element having at least two switching states.

4. The device of claim 1, wherein the nanoelectrode is coupled to a surface of a substrate.

5. The device of claim 4, wherein the nanoelectrode and the resistive change material are substantially horizontal or perpendicular to the substrate.

6. The device of claim 1, wherein the gap is a nanogap.

7. The device of claim 1, wherein the nanogap is formed by applying an electrical, mechanical, optical or chemical cutting signal to the nanoelectrode.

8. The device of claim 1, wherein the nanoelectrode is a carbon nanotube or a graphene ribbon.

9. The device of claim 1, wherein the resistive change material is a phase-change material.

10. The device of claim 9, wherein the phase change material comprises at least one of GST ($Ge_2Sb_2Te_5$), $Sb_2Te_3$, GeTe or AsTe (chalcogenide glasses).

11. The device of claim 1, wherein at least one of a first terminal or a second terminal of the nanoelectrode is coupled to a decoder circuit for selectively reading a state of resistive change material, and wherein at least one of the first terminal or the second terminal of the nanoelectrode is coupled to an encoder circuit for selectively changing a state of resistive change material.

12. The device of claim 1, wherein at least one of a first terminal or a second terminal of the nanoelectrode is coupled to a transistor to control an operation of the transistor.

13. The device of claim 1, wherein the device is incorporated in and provides a memory function for one of a computer, a communication device, an appliance, a vehicle, or combinations thereof.

14. A method, comprising:
applying from a voltage source a first signal to a terminal of an electrode to program a non-volatile memory state of a resistive change material, wherein the resistive change material is located in a nanogap of the electrode; and
receiving at a sensor a second signal supplied by the terminal indicating that the resistive change material has been programmed to the non-volatile memory state.

15. The method of claim 14, wherein electrode is a carbon nanotube or graphene ribbon.

16. The method of claim 14, wherein the resistive change material is a phase-change material.

17. The method of claim 14, wherein the voltage source is an encoder circuit.

18. The method of claim 14, wherein the sensor is a decoder circuit.

19. A method, comprising:
constructing a nanoelectrode;
creating a gap in the nanoelectrode thereby forming first and second segments of the nanoelectrode; and
inserting a resistive change material in the gap, wherein a combination of the first and second segments of the nanoelectrode and the resistive change material forms a memory cell programmable to at least two memory states.

20. The method of claim 19, wherein the nanoelectrode is a carbon nanotube or graphene ribbon, and wherein the resistive change material is a phase-change material.

21. The method of claim 19, wherein a first memory state of the at least two memory states is a first resistivity state of the resistive change material, and a second memory state of the at least two memory states is a second resistivity state of the resistive change material.

22. The method of claim 19, comprising duplicating a construction of the memory cell to form an array of memory cells.

23. The method of claim 22, comprising coupling the array of memory cells to a decoder circuit and an encoder circuit.

24. The method of claim 23, comprising packaging the array of memory cells, the decoder circuit and the encoder circuit to form a memory component used by a computing device.

* * * * *